United States Patent
Dulasky

(10) Patent No.: US 6,232,784 B1
(45) Date of Patent: May 15, 2001

(54) CIRCUIT CONTINUITY TESTER AND METHOD

(76) Inventor: Richard Dulasky, 931 N. Salina St., Syracuse, NY (US) 13208

(*) Notice: Subject to any disclaimer, the term of this patent is extended or adjusted under 35 U.S.C. 154(b) by 0 days.

(21) Appl. No.: 09/207,002

(22) Filed: Dec. 7, 1998

Related U.S. Application Data

(63) Continuation-in-part of application No. 08/935,154, filed on Sep. 22, 1997, now abandoned.

(51) Int. Cl.$^7$ .................................................... G01R 31/00
(52) U.S. Cl. ............................................. 324/506; 324/507
(58) Field of Search .................................... 324/506, 507, 324/157; 362/202, 203, 204; D10/75, 78

(56) References Cited

U.S. PATENT DOCUMENTS

| | | | | |
|---|---|---|---|---|
| 3,711,768 | * | 1/1973 | Frazin | 324/507 |
| 3,753,090 | * | 8/1973 | Tomek | 324/506 |
| 3,775,677 | * | 11/1973 | Garrett et al. | 324/506 |
| 4,150,330 | * | 4/1979 | Hudson et al. | 324/507 |
| 5,406,207 | * | 4/1995 | Shershen | 324/506 |

* cited by examiner

Primary Examiner—Safet Metjahic
Assistant Examiner—Vincent Q. Nguyen
(74) Attorney, Agent, or Firm—George R. McGuire; Hancock & Estabrook, LLP

(57) ABSTRACT

A conventional flashlight is adapted for use as a circuit continuity tester. The flashlight has the usual hollow body containing the batteries, a bulb having one contact in communication with the positive battery terminal and the other contact connected, through an on-off switch, to a conducting, exterior portion of the flashlight, and thence to a conducting spring which completes the circuit to the negative battery terminal. The flashlight is modified by providing a passageway through the end cap which threads to the lower end of the body, passing a wire through the passageway, and soldering one end of the wire to a metal washer having a plastic coating on one side and the other end to a metal pocket clip which detachably connects to the body. The washer is placed in contact with the negative battery terminal with the plastic layer insulating the washer from contact with the spring. With the switch in the "on" position, illumination of the bulb indicates circuit continuity between one point, contacted by the pocket clip, and a second point, contacted by the metal exterior of the flashlight.

20 Claims, 2 Drawing Sheets

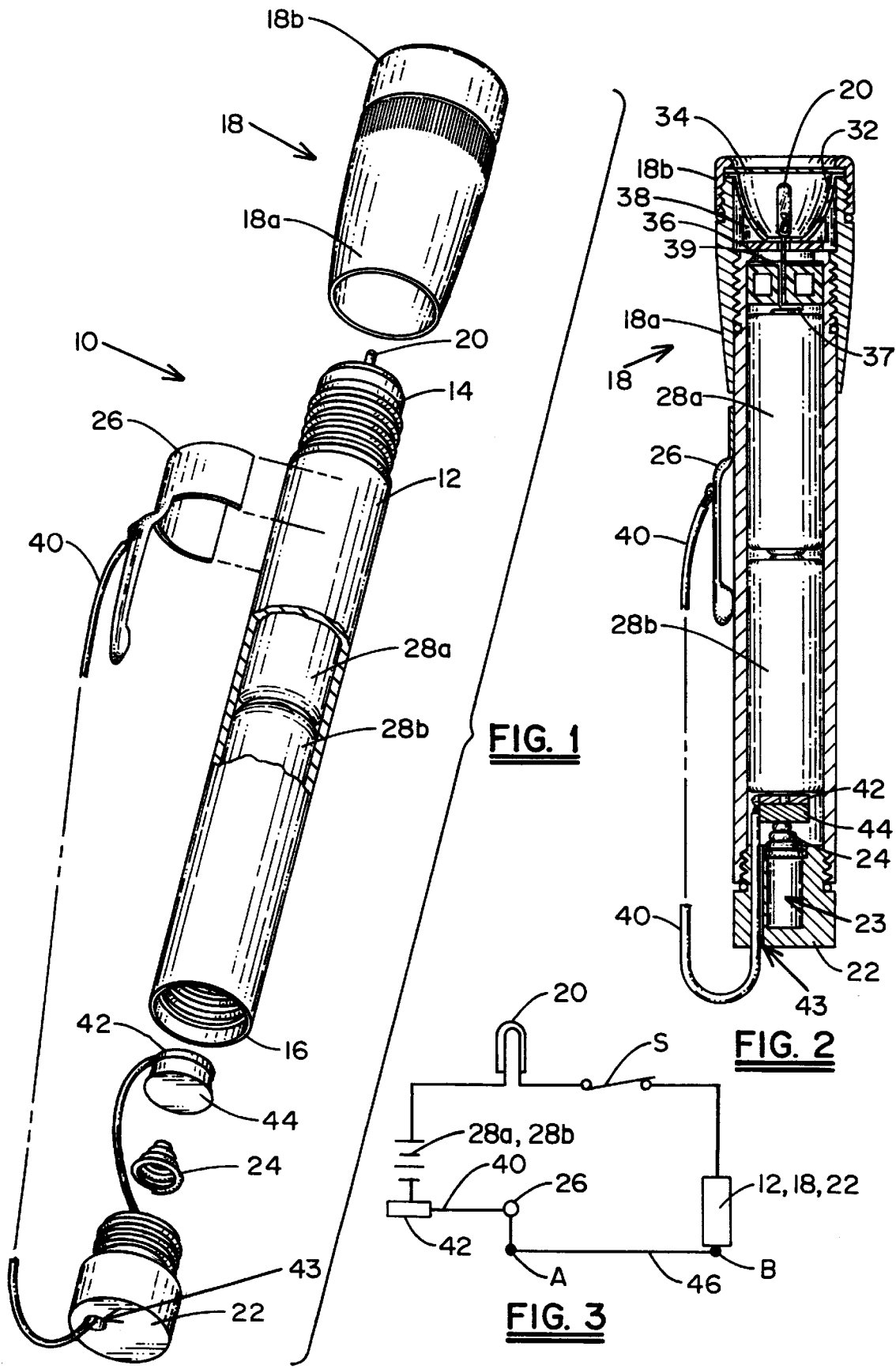

CIRCUIT CONTINUITY TESTER AND METHOD

This application is a continuation-in-part of Ser. No. 08,935,154 filed Sep. 22, 1997 now abandoned.

BACKGROUND OF THE INVENTION

The present invention relates to means of testing continuity of an electrical circuit and, more specifically, to apparatus for adapting a conventional flashlight for use as a continuity tester.

In many electrical applications, it is sometimes necessary or desirable to have a quick and easy means for testing circuit continuity, i.e., for determining whether there is an electrical path for current flow between two points. Many devices have been provided in the prior art for performing this function. Among such devices are those which include an incandescent bulb or other light-emitting means for providing a visual indication of presence or absence of circuit continuity in the apparatus or line under test. Often, the continuity tester includes a pair of wires terminating in alligator clips for attachment at the points between which continuity is to be tested. The prior art also includes means for modifying conventional flashlights to permit their use as circuit continuity testers.

The principal object of the present invention is to provide novel and improved means for adapting a conventional flashlight to act as a circuit continuity tester.

SUMMARY OF THE INVENTION

The apparatus of the invention is used in conjunction with a conventional hand-held flashlight, preferably of compact construction, having a detachable metal clip by which it may be attached to a pocket or other part of the clothing. The flashlight includes the usual hollow body portion wherein the battery or batteries are mounted. Upper and lower end caps are threaded to opposite ends of the body, the bulb being mounted in the upper end in conductive relation with the positive battery terminal. An electrically conducting spring is urged by the lower end cap, when the latter is fully engaged with the body, into conductive contact with the negative side of the batteries. Both end caps and the body, as well as the spring, are of conductive material and thus in electrical connection with the negative side of the batteries. An on-off switch is provided to selectively make or break the circuit connecting the bulb to the negative terminal of the batteries.

According to the present invention, an insulated electrical wire passes through an opening provided for such purpose in the lower end cap, placing one end of the wire inside and the other end outside the flashlight body. The end inside the body is soldered to an electrically conductive member, e.g., a rivet or a metal washer of appropriate size, and the end outside the body is soldered to the metal pocket clip which may be selectively placed in or removed from encircling relation to the flashlight body. The plate to which the inner end of the wire is soldered is placed between the spring and the negative side of the battery, being urged into conductive contact with the battery by the spring. In a first disclosed embodiment, a layer of insulating material is interposed between the metal plate and the spring, preferably by being coated upon or otherwise affixed to the surface of the plate opposing the spring. In a second disclosed embodiment, the normal flashlight spring is removed and replaced by a layer of somewhat resilient electrically insulating material which is compressed between the end cap and negative battery terminal; the head of a rivet is urged by the resilient layer into engagement with the negative battery terminal and the stem of the rivet extends into a through opening in the resilient layer where it contacts the end of the wire inside the flashlight body.

Thus, with the flashlight switch in the "on" position, the bulb is illuminated only when the metal pocket clip and metal exterior of the flashlight, i.e., the end caps or body, are placed in contact with two points between which electrical continuity exists. In this manner, the modified flashlight may be employed to test for circuit continuity between two points simply by placing the pocket clip in contact with one point and any other exterior surface in contact with the other point and observing whether or not the bulb illuminates.

The foregoing and other features of construction and operation of the invention will be more readily understood and fully appreciated from the following detailed description, taken in conjunction with the accompanying drawing.

BRIEF DESCRIPTION OF THE DRAWING

FIG. 1 is an exploded, perspective view of a flashlight modified for use in the present invention;

FIG. 2 is an elevational view, in full section, of the flashlight of FIG. 1;

FIG. 3 is a schematic illustration of the operation of the invention;

DETAILED DESCRIPTION

Figure 5:
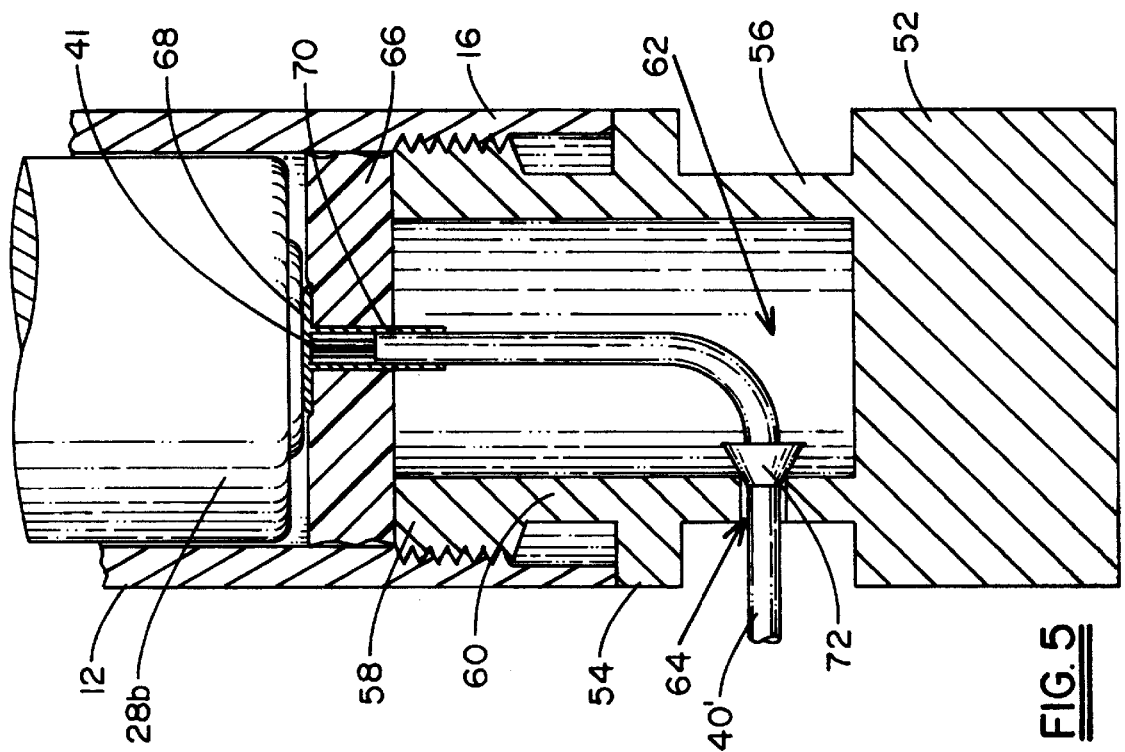
FIG. 5 is a fragmentary, enlarged, elevational view of portions of the apparatus of FIG. 4.

Referring now to FIGS. 1 and 2, a flashlight modified in accordance with the teachings of the present invention is denoted generally by reference numeral 10. Flashlight 10 is preferably of somewhat compact construction, an example of a commercially available product suitable for modification to the construction of the circuit tester of the present invention being that sold under the trademark Mini-Maglite by MAG Instrument, having an axial length of about six inches. The conventional portions of flashlight 10 include hollow, cylindrical body member 12, having what are termed upper and lower ends 14 and 16, respectively, upper end cap 18, bulb 20, lower end cap 22, coil spring 24 and metal pocket clip 26. Body member upper end 14 is externally threaded to engage upper end cap 18, and lower end 16 is internally threaded to engage lower end cap 22. Bulb 20 is powered by a pair of AA-size batteries 28a and 28b which are mounted in series within body member 12.

As best seen in FIG. 2, upper end cap 18 includes two threadedly connected portions, 18a and 18b. Portion 18a carries the usual reflector 32 and lens 34, access to which is provided by removal of portion 18b. A pair of leads extend from bulb 20 through openings in circular plate 36, which is rotatably carried in upper end 14 of body member 12. Plate 36 is engaged by opposing surfaces of fins 38 on reflector 32 (providing on-off switch). Spring 24 is installed between lower end cap 22 and the lower end of battery 28b. In the conventional, unmodified form of flashlight 10, when end caps 18 and 20 are fully engaged with the upper and lower ends of body member 12, spring 24 is compressed between lower end cap 22 and battery 28b, being in conductive contact with the negative terminal thereof. The positive terminal of battery 28b is urged into contact with the negative terminal of battery 28a, and the positive terminal of the latter is positioned for contact with the leads of bulb 20.

All parts thus far described are present in a commercially available, unmodified flashlight. Modification thereof to provide the circuit continuity tester of the present invention involves drilling a hole 43 through lower end cap 22 and inserting therethrough insulated wire 40 whereby, when end cap 22 is engaged with lower end 16 of body 12, one end of wire 40 is inside and the other end outside the body. A bare portion (i.e., with insulation removed) of the end of wire 40 outside the flashlight body is soldered or otherwise connected to clip 26, and the end inside the body is connected to conducting plate 42, e.g., a metal washer. When the parts are assembled, one side of plate 42 is urged by spring 24 into conductive contact with the negative side of battery 28b. The other side of plate 42 is coated with a layer of plastic or other non-conductive material 44. Thus, spring 24, and consequently lower end cap 22, body 12 and upper end cap 18, are not in conductive contact with the negative side of battery 28b.

The modified flashlight 10 may now be used to test for circuit continuity between two points. For example, the schematic diagram of FIG. 3 indicates an electrical path 46 between points A and B. Metal pocket clip 26 is detached from body 12, and the on-off switch is placed in the "on" position. Bulb 20 does not illuminate since it is not in electrical communication with the negative side of the batteries. However, such communication is provided when clip 26 is placed in contact with point A, and any part of the metal exterior of the flashlight (body 10, upper end cap 18 or lower end cap 22) is placed in contact with point B. Illumination of bulb 20 indicates circuit continuity between points A and B; conversely, non-illumination indicates an interruption, or non-continuity, of a conducting path between points A and B.

Figure 4:
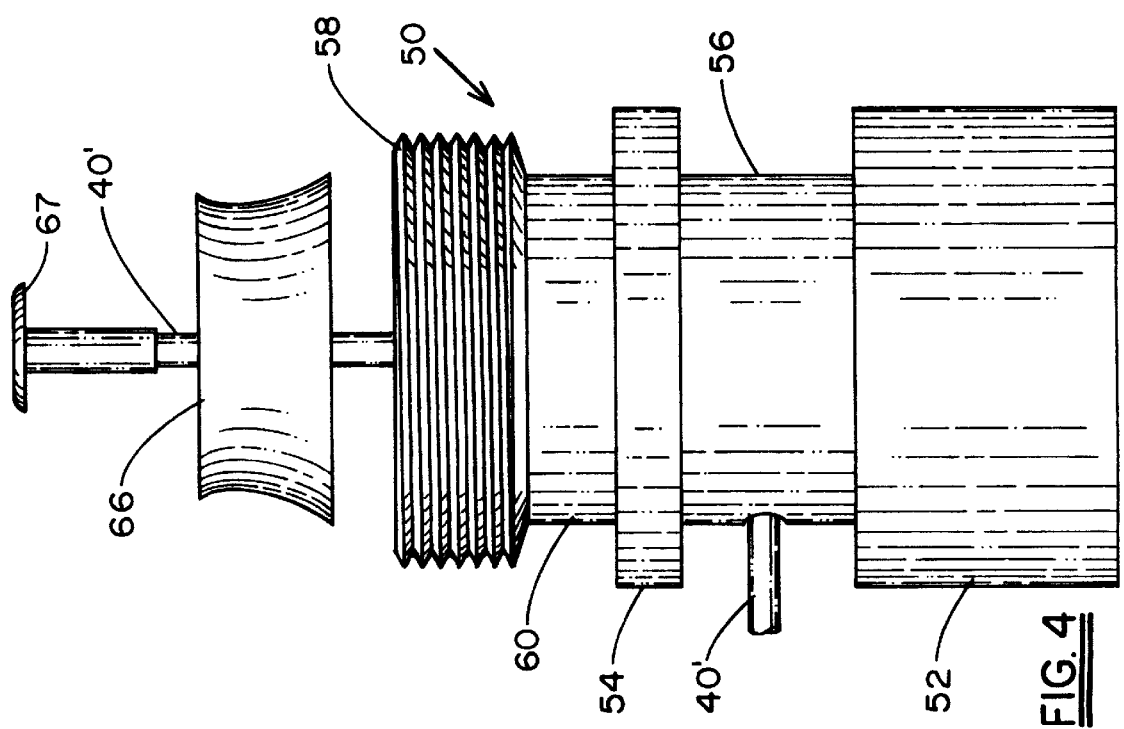
FIG. 4 is an elevational view of an alternate embodiment of apparatus for modification of the flashlight of FIGS. 1 and 2.

An alternate version of apparatus for adapting a conventional flashlight to use as a circuit continuity tester is shown in FIGS. 4 and 5. Rather than drilling a passageway through the lower end cap which is part of the conventional flashlight, the end cap and the conventional coil spring are removed and replaced by the apparatus of this version which, in most applications, will be preferred over the first disclosed version. End cap 22 is replaced by unitary member 50, of electrically conducting material, having cylindrical portions 52 and 54 of essentially the same diameter as flashlight body 12 and separated by first smaller diameter portion 56. Externally threaded portion 58, separated from portion 54 by second smaller diameter portion 60, mates with the internal threads at lower end 16 of body 12. Internal cavity 62 extends through portions 58, 60, 54 and 56, and through opening 64 communicates with cavity 62 through portion 56.

Wire 40' extends through the passageway provided by internal cavity 62 and opening 64. The bare end portion of the wire remote from member 50 is electrically connected to clip 26, as in the previously described version. Cylindrical bushing 66 of somewhat resilient, electrically insulating material has a central opening and a diameter substantially equal to that of threaded portion 58. An electrically conducting rivet 67 includes head 68 and stem 70 which extends into the central opening of bushing 66. Bare end 41 of wire 40' is electrically connected to rivet 67 by soldering and/or being inserted in the hollow interior of stem 70 and crimping the stem, or by other means. When portion 58 is fully engaged with lower end 16 of flashlight body 12, bushing 66 is compressed between the end of section 58 and the lower end of battery 28b. Rivet head 68 is urged into electrical engagement with the negative terminal of battery 28b, thereby placing clip 26 in communication, through wire 40, with the negative side of the batteries.

As a further refinement, enlarged portion 72 is preferably affixed to wire 40', as shown in FIG. 5. Portion 72 may be a conical piece of insulation with a maximum diameter greater than that of opening 64, or may simply be a knot in wire 40'. In any event, portion 72 is so positioned that it prevents an outwardly pulling force on wire 40' from being applied to the portion of the wire within cavity 62, tending to pull rivet head 68 away from the negative terminal of battery 28b, and/or disturbing the connection between wire end 41 and rivet 67. Providing engagement portion 72 with a conical configuration offers the added advantage of its acting as a seal, effectively preventing entry of moisture and foreign matter into internal cavity 62.

Operation of the modified flashlight as a circuit tester is the same in both disclosed versions. The probe, represented in the disclosed versions as a pocket clip, is placed in contact with one of the points between which continuity is to be tested and any other exterior portion of the flashlight (upper or lower end cap or body) is placed in contact with the other point. With the conventional switch in the "on" or closed position, the bulb will illuminate only if the circuit between the negative battery terminal and the bulb contact is completed by circuit continuity between the two points. Thus, the invention involves breaking the usual circuit continuity between the negative battery terminal and one side of the on-off switch in a conventional flashlight and providing a probe (clip) to complete the circuit. It should be noted that the probe will complete the circuit between the switch and negative battery terminal by being in electrical contact with the flashlight body, thereby permitting normal use of the flashlight through the on-off switch, as well as when detached from the body and used in circuit continuity testing. Any excess length of wire 40' outside the flashlight body may be neatly wrapped around reduced diameter portion 56 of member 50 when clip 26 is affixed to body 12.

What is claimed is:

1. Apparatus for attachment to a conventional flashlight to adapt said flashlight for use as a device for testing electrical circuit continuity between first and second points, said flashlight comprising:

I) an electrically conducting body portion having a hollow interior accessible through an opening;

ii) battery means having positive and negative terminals mounted within said hollow interior;

iii) a bulb having first and second contacts for connection across said terminals for illumination of said bulb;

iv) a selectively operable switch; and v) means connecting said first contact to said positive terminal, said second contact to one side of said switch, and the other side of said switch to said body portion;

said apparatus comprising:

a) an electrically conducting cap member having a first portion engageable with said body portion to retain said cap member in a position closing said body portion opening;

b) a passageway extending through said cap member between the interior and exterior of said body portion;

c) a flexible, electrically insulated wire extending through said passageway and having opposite, bare end portions;

d) a bushing of electrically insulating material positioned between said cap member and said battery negative terminal;

e) an electrically conducting member positioned between said bushing and said negative terminal and conductively contacting said negative terminal;

f) an electrically conducting clip selectively engageable with said body portion to provide means for releasably attaching said flashlight to an article of clothing; and g) means electrically attaching one of said wire end portions to said electrically conducting member and the other to said clip, whereby said clip may be removed from engagement with said body portion and placed in contact with said first point and either of said body portion or said cap member in contact with said second point to test for electrical continuity between said first and second points.

2. The apparatus of claim 1 wherein said electrically conducting member comprises a metal rivet having head and stem portions, said head portion being engaged between said bushing and said negative battery terminal.

3. The apparatus of claim 2 wherein said bushing has a central, through opening and said stem portion extends into said central opening.

4. The apparatus of claim 3 wherein said stem portion is hollow and said one of said wire end portions extends into said stem portion.

5. The apparatus of claim 1 and further including means for preventing a pulling force exerted on the portion of said wire outside said passageway on the side connected to said clip from being applied to the portion of said wire inside said passageway.

6. The apparatus of claim 5 wherein said means for preventing comprise a conical member affixed to said wire at a predetermined longitudinal position thereon.

7. The apparatus of claim 5 wherein said passageway includes at least two, mutually communicating, cylindrical portions of relatively larger and smaller diameters.

8. The apparatus of claim 7 wherein said means for preventing comprises a predetermined portion of said wire having a cross dimension larger than said relatively smaller diameter portion of said passageway.

9. The apparatus of claim 8 wherein said predetermined portion engages the periphery of said relatively smaller diameter portion of said passageway to form a seal for said relatively larger diameter portion.

10. The apparatus of claim 1 wherein said cap member further includes a stem portion, integral with and extending from said first portion, upon which a portion of said wire may be wound.

11. Apparatus used in conjunction with flashlight components for testing electrical circuit continuity between first and second points, said flashlight components including:

I) a hollow, cylindrical body portion having upper and lower ends, predetermined inside and outside diameters and an electrically conducting external surface;

ii) cylindrical battery means having positive and negative terminals mounted within said body portion, said negative terminal being accessible through said lower end;

iii) a bulb having a first contact permanently connected to said positive terminal, and a second contact; and iv) a manually operable switch having one side connected to said second contact and the other side electrically connected to said external surface; said apparatus comprising:

a) an end cap of electrically conducting material having a plurality of integral, cylindrical sections symmetrically arranged about a central axis, a first of said sections having a diameter substantially equal to said inside diameter for insertion of said first section into and releasable engagement with said lower end of said body portion;

b) a passageway extending through said end cap and communicating between the interior and exterior of said hollow body portion when said end cap is engaged with said lower end;

c) a flexible, electrically insulated wire extending through said passageway;

d) a pocket clip of electrically conducting material for releasable connection to said body portion external surface to provide, when so connected, means for attaching said flashlight to an article of clothing;

e) a bushing of electrically insulating material having a through opening;

f) a contact member of electrically conducting material;

g) first means electrically connecting one end of said wire to said contact member with at least one of said contact member and said wire passing through said bushing opening to retain said bushing between said contact member and said first end cap section; and h) second means electrically connecting the other end of said wire to said clip, whereby said clip is electrically connected through said wire and contact member with said negative terminal when said second end cap section is connected to said body lower end to urge said bushing toward, and said contact member into electrical contact with, said negative terminal.

12. The apparatus of claim 11 and further including means within said passageway for preventing withdrawal of said wire from said passageway in the direction of said clip past a predetermined position on said wire.

13. The apparatus of claim 12 wherein said means for preventing comprise an enlarged portion at said predetermined position on said wire.

14. The apparatus of claim 13 wherein said passageway includes a larger diameter portion communicating with said bushing side of said end cap and a smaller diameter portion communicating with said clip side of said end cap, said first and second passageway portions communicating with one another internally of said end cap.

15. The apparatus of claim 14 wherein said enlarged portion extends outwardly from the insulation on said wire at said predetermined position to a cross dimension less than said larger diameter and larger than said smaller diameter, whereby said enlarged portion is prevented from moving into said second portion of said passageway.

16. The apparatus of claim 15 wherein said enlarged portion is substantially cone-shaped, coaxial with said wire and positioned with its small end toward said second portion of said passageway, whereby said enlarged portion may engage the end of said second portion of said passageway which communicates with said first portion to provide a seal essentially preventing entry of moisture and foreign matter into said first portion of said passageway.

17. The apparatus of claim 11 wherein said bushing is substantially cylindrical, and is compressed between said end cap and said negative battery terminal when said end cap is fully engaged with said lower body portion of said flashlight.

18. The apparatus of claim 17 wherein said contact member is a metal rivet having head and stem portions.

19. The apparatus of claim 18 wherein said rivet head is urged into electrical contact with said negative battery terminal and said rivet stem extends into said through opening in said bushing.

20. The apparatus of claim 19 wherein said rivet stem is hollow and said one end of said wire is positioned within said rivet stem.

* * * * *